(12) United States Patent
Hashimoto

(10) Patent No.: US 7,235,879 B2
(45) Date of Patent: Jun. 26, 2007

(54) SEMICONDUCTOR DEVICE AND METHOD OF MANUFACTURING THE SAME, ELECTRONIC DEVICE AND METHOD OF MANUFACTURING THE SAME, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/828,101

(22) Filed: Apr. 19, 2004

(65) Prior Publication Data

US 2004/0245612 A1 Dec. 9, 2004

(30) Foreign Application Priority Data

Apr. 21, 2003 (JP) ............................. 2003-115891

(51) Int. Cl.
*H01L 23/52* (2006.01)
*H01L 23/48* (2006.01)
*H01L 29/40* (2006.01)

(52) U.S. Cl. ................. 257/734; 257/E23.07; 257/668; 257/678; 257/773; 349/149

(58) Field of Classification Search ................ 257/668, 257/678, 669, 737, 734, 773, 778, E21.069, 257/E23.07; 349/149

See application file for complete search history.

(56) References Cited

U.S. PATENT DOCUMENTS

| | | | | |
|---|---|---|---|---|
| 5,726,491 A * | 3/1998 | Tajima et al. | ............... | 358/1.18 |
| 5,726,726 A | 3/1998 | Nakanishi | ................... | 349/149 |
| 5,821,608 A * | 10/1998 | DiStefano et al. | .......... | 257/669 |
| 5,874,782 A * | 2/1999 | Palagonia | ................... | 257/778 |
| 6,013,944 A * | 1/2000 | Moriya et al. | .............. | 257/668 |
| 6,097,097 A * | 8/2000 | Hirose | ........................ | 257/778 |
| 6,211,572 B1 * | 4/2001 | Fjelstad et al. | ............. | 257/781 |
| 6,255,737 B1 | 7/2001 | Hashimoto | ................... | 257/784 |
| 6,323,542 B1 | 11/2001 | Hashimoto | ................... | 257/669 |
| 6,392,287 B1 * | 5/2002 | Kang | .......................... | 257/669 |
| 6,433,427 B1 * | 8/2002 | Wu et al. | .................... | 257/737 |
| 6,437,432 B2 * | 8/2002 | Ikumo et al. | ............... | 257/691 |
| 6,441,500 B1 * | 8/2002 | Sumikawa et al. | ......... | 257/780 |
| 6,475,896 B1 | 11/2002 | Hashimoto | ................... | 438/613 |
| 6,602,803 B2 * | 8/2003 | Yew et al. | .................... | 438/780 |
| 6,738,123 B1 * | 5/2004 | Takahashi et al. | .......... | 349/152 |
| 6,784,557 B2 * | 8/2004 | Nakamura et al. | .......... | 257/784 |

(Continued)

FOREIGN PATENT DOCUMENTS

JP      09-033940      2/1997

(Continued)

OTHER PUBLICATIONS

U.S. Appl. No. 10/829,146, filed Apr. 21, 2004, Hashimoto.

*Primary Examiner*—Kenneth Parker
*Assistant Examiner*—Chris Chu
(74) *Attorney, Agent, or Firm*—Hogan & Hartson LLP

(57) ABSTRACT

A semiconductor device including: a semiconductor substrate in which an integrated circuit is formed; an insulating layer formed on the semiconductor substrate and having a first surface and a second surface which is higher than the first surface; a first electrode formed to avoid the second surface and electrically connected to the inside of the semiconductor substrate; and a second electrode formed on the second surface and electrically connected to the inside of the semiconductor substrate.

2 Claims, 8 Drawing Sheets

U.S. PATENT DOCUMENTS

2002/0079575 A1 * 6/2002 Hozoji et al. ............... 257/734

FOREIGN PATENT DOCUMENTS

| JP | 09-152621 | 6/1997 |
|---|---|---|
| JP | 2798027 | 7/1998 |
| JP | 11-204677 | 7/1999 |
| JP | 11-220069 | 8/1999 |

\* cited by examiner

SEMICONDUCTOR DEVICE AND METHOD OF MANUFACTURING THE SAME, ELECTRONIC DEVICE AND METHOD OF MANUFACTURING THE SAME, AND ELECTRONIC INSTRUMENT

Japanese Patent Application No. 2003-115891, filed on Apr. 21, 2003, is hereby incorporated by reference in its entirety.

BACKGROUND OF THE INVENTION

The present invention relates to a semiconductor device, a method of manufacturing the semiconductor device, an electronic device, a method of manufacturing the electronic device, and electronic instrument.

A face down bonding is known as a mounting form for a semiconductor chip. This mounting form is used on the premise that the semiconductor chip is mounted in a region without a level difference. Therefore, it is difficult to mount a semiconductor chip in a region with a level difference while preventing occurrence of a connection failure.

BRIEF SUMMARY OF THE INVENTION

According to a first aspect of the present invention, there is provided a semiconductor device comprising:

a semiconductor substrate in which an integrated circuit is formed;

an insulating layer formed on the semiconductor substrate and having a first surface and a second surface which is higher than the first surface;

a first electrode formed to avoid the second surface and electrically connected to the inside of the semiconductor substrate; and a second electrode formed on the second surface and electrically connected to the inside of the semiconductor substrate.

According to a second aspect of the present invention, there is provided an electronic device comprising:

the above semiconductor device;

a support member which includes a first support surface and a second support surface lower than the first support surface;

a first interconnecting pattern formed on the first support surface; and a second interconnecting pattern formed on the second support surface, wherein:

the first electrode of the semiconductor device faces and is electrically connected to the first interconnecting pattern; and the second electrode of the semiconductor device faces and is electrically connected to the second interconnecting pattern.

According to a third aspect of the present invention, there is provided an electronic device comprising the above semiconductor device.

According to a fourth aspect of the present invention, there is provided an electronic instrument comprising the above electronic device.

According to a fifth aspect of the present invention, there is provided a method of manufacturing a semiconductor device, comprising:

forming an insulating layer having a first surface and a second surface which is higher than the first surface on a semiconductor substrate in which an integrated circuit is formed;

forming a first electrode electrically connected to the inside of the semiconductor substrate to avoid the second surface; and forming a second electrode electrically connected to the inside of the semiconductor substrate on the second surface.

According to a sixth aspect of the present invention, there is provided a method of manufacturing an electronic device, comprising:

mounting the semiconductor device as defined in claim 1 on a support member which includes a first support surface and a second support surface lower than the first support surface, wherein:

a first interconnecting pattern is formed on the first support surface;

a second interconnecting pattern is formed on the second support surface; and in the mounting step, the first electrode of the semiconductor device is disposed to face the first interconnecting pattern to be electrically connected, and the second electrode of the semiconductor device is disposed to face the second interconnecting pattern to be electrically connected.

According to a seventh aspect of the present invention, there is provided a method of manufacturing an electronic device, comprising:

disposing the first electrode of the semiconductor device as defined in claim 1 to face a first interconnecting pattern formed on a first substrate to be electrically connected; and disposing the second electrode of the semiconductor device to face a second interconnecting pattern formed on a second substrate to be electrically connected; and attaching the first substrate to the second substrate so that an electrical connection portion of the first interconnecting pattern with the first electrode overlaps the second substrate.

DETAILED DESCRIPTION OF THE EMBODIMENTS

Figure 1:
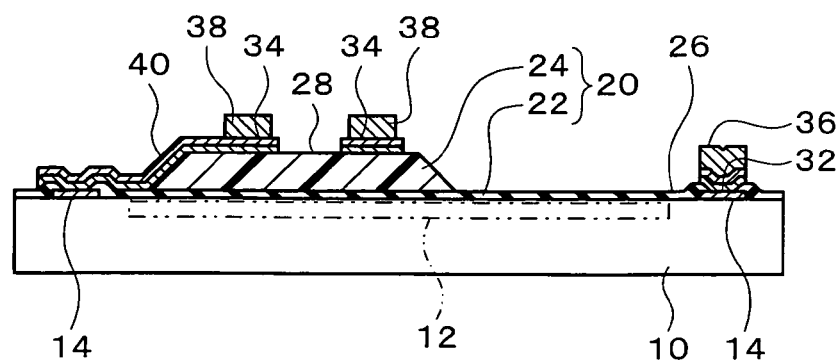
FIG. 1 is a cross-sectional view taken along the line I—I shown in FIG. 2.

An objective of the embodiments of the present invention is to enable mounting in a region with a level difference.

(1) According to a first embodiment of the present invention, there is provided a semiconductor device comprising:

a semiconductor substrate in which an integrated circuit is formed;

an insulating layer formed on the semiconductor substrate and having a first surface and a second surface which is higher than the first surface;

a first electrode formed to avoid the second surface and electrically connected to the inside of the semiconductor substrate; and a second electrode formed on the second surface and electrically connected to the inside of the semiconductor substrate.

Since the first and second electrodes are formed on the surfaces at different heights, the semiconductor device can be mounted in a region with a level difference.

(2) The semiconductor device may further comprise a bump formed on at least one of the first and second electrodes.

(3) In the semiconductor device, the first and second electrodes may be formed so as not to be electrically connected to the outside of the semiconductor substrate.

(4) In the semiconductor device, the insulating layer may include a first insulating layer formed on the semiconductor substrate and having the first surface, and a second insulating layer formed on the first insulating layer and having the second surface.

(5) In the semiconductor device, the second insulating layer may be formed at a position close to one of end portions of the semiconductor substrate.

(6) In the semiconductor device, a plurality of pads electrically connected to the inside of the semiconductor substrate may be formed on the semiconductor substrate; and the semiconductor device may further comprise an interconnecting line which electrically connects one of the pads to the second electrode.

(7) In the semiconductor device, one of the pads may be the first electrode.

(8) The semiconductor device may comprise a plurality of the first electrodes, wherein at least one of the first electrodes is formed on the first surface.

(9) According to a second embodiment of the present invention, there is provided an electronic device comprising:

the semiconductor device as defined in claim 1;

a support member which includes a first support surface and a second support surface lower than the first support surface;

a first interconnecting pattern formed on the first support surface; and a second interconnecting pattern formed on the second support surface, wherein:

the first electrode of the semiconductor device faces and is electrically connected to the first interconnecting pattern; and the second electrode of the semiconductor device faces and is electrically connected to the second interconnecting pattern.

This semiconductor device includes the first and second electrodes formed on the surfaces at different heights, and is mounted in a region with a level difference (or the first and second support surfaces).

(10) In the electronic device, the support member may include first and second substrates which overlap each other to provide an overlapping region;

the first support surface may include a surface of the first substrate opposite to the second substrate and within the overlapping region; and the second support surface may include a surface of the second substrate on the side of the first substrate and outside the overlapping region.

(11) According to a third embodiment of the present invention, there is provided an electronic device comprising the above semiconductor device.

(12) According to a fourth embodiment of the present invention, there is provided an electronic instrument comprising the above electronic device.

(13) According to a fifth embodiment of the present invention, there is provided a method of manufacturing a semiconductor device, comprising:

forming an insulating layer having a first surface and a second surface which is higher than the first surface on a semiconductor substrate in which an integrated circuit is formed;

forming a first electrode electrically connected to the inside of the semiconductor substrate to avoid the second surface; and forming a second electrode electrically connected to the inside of the semiconductor substrate on the second surface.

Since the first and second electrodes are formed on the surfaces at different heights, the semiconductor device can be mounted in a region with a level difference.

(14) According to a sixth embodiment of the present invention, there is provided a method of manufacturing an electronic device, comprising:

mounting the semiconductor device as defined in claim 1 on a support member which includes a first support surface and a second support surface lower than the first support surface, wherein:

a first interconnecting pattern is formed on the first support surface;

a second interconnecting pattern is formed on the second support surface; and in the mounting step, the first electrode of the semiconductor device is disposed to face the first interconnecting pattern to be electrically connected, and the second electrode of the semiconductor device is disposed to face the second interconnecting pattern to be electrically connected.

Since the first and second electrodes of the semiconductor device are formed on the surfaces at different heights, the semiconductor device can be mounted in a region with a level difference (or the first and second support surfaces).

(15) According to a sixth embodiment of the present invention, there is provided a method of manufacturing an electronic device, comprising:

disposing the first electrode of the semiconductor device as defined in claim 1 to face a first interconnecting pattern formed on a first substrate to be electrically connected; and disposing the second electrode of the semiconductor device to face a second interconnecting pattern formed on a second substrate to be electrically connected; and attaching the first substrate to the second substrate so that an electrical connection portion of the first interconnecting pattern with the first electrode overlaps the second substrate.

According to this method of manufacturing an electronic device, a level difference is formed by allowing the first substrate to overlap the second substrate. However, since the first and second electrodes of the semiconductor device are formed on the surfaces at different heights, it is possible to deal with the level difference.

Figure 2:
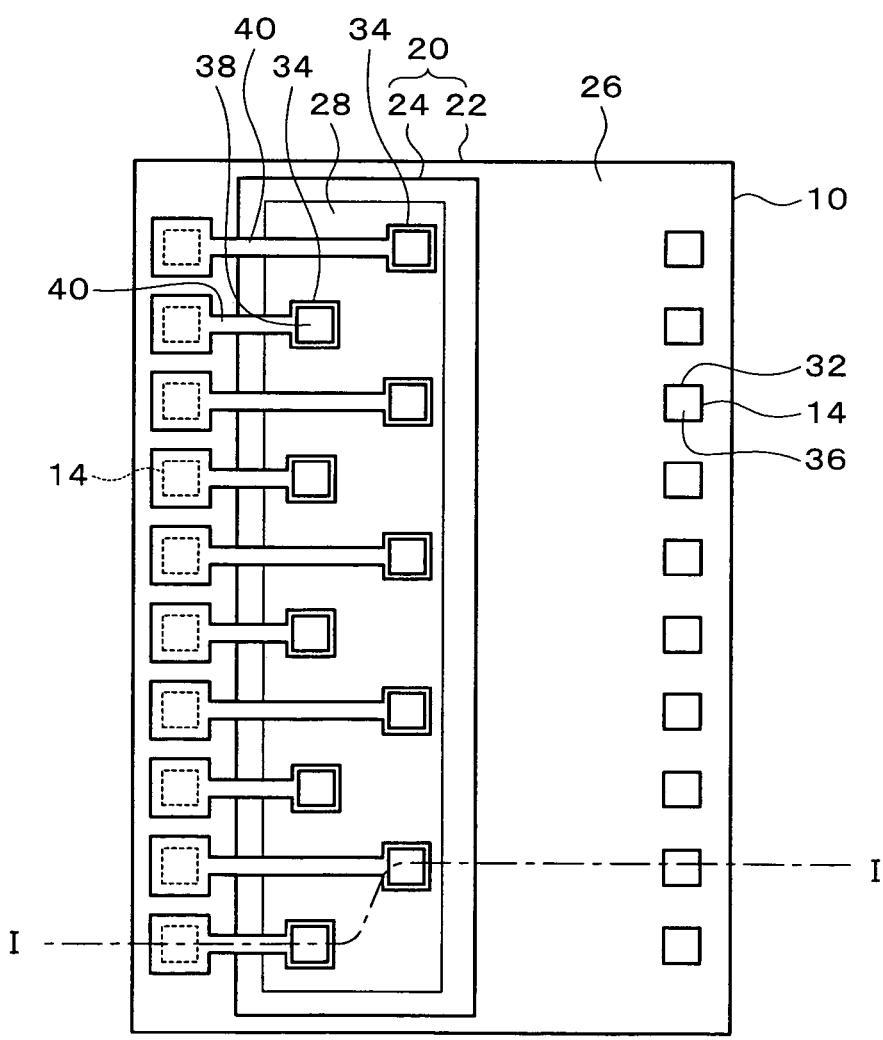
FIG. 2 is a plan view showing a semiconductor device according to one embodiment of the present invention.

The embodiments of the present invention are described below with reference to the drawings. FIG. 1 is illustrative of a semiconductor device according to one embodiment of the present invention, and is a cross-sectional view taken along the line I—I shown in FIG. 2. FIG. 2 is a plan view illustrating the semiconductor device according to the embodiment of the present invention.

The semiconductor device includes a semiconductor substrate 10 (semiconductor chip or semiconductor wafer). An integrated circuit 12 is formed in the semiconductor substrate 10. In the case where the semiconductor substrate 10 is a semiconductor wafer, a plurality of integrated circuits 12 are formed in the semiconductor substrate 10.

A plurality of pads 14 are formed on the semiconductor substrate 10. The pads 14 are electrically connected to the inside of the semiconductor substrate 10. The pads 14 may be part (or ends) of interconnecting lines electrically connected to the integrated circuit 12. The pads 14 may be disposed in the peripheral (or end) portions of the surface of the semiconductor substrate 10. The pads 14 may be formed along four sides or two sides of the surface of the semiconductor substrate 10, for example. The pad 14 is formed of Al, for example. Although not illustrated in FIG. 1, the pad 14 may be formed so as to overlap the integrated circuit 12.

An insulating layer 20 (electrical insulating layer in more detail) is formed on the semiconductor substrate 10. The insulating layer 20 may include first and second insulating layers 22 and 24. The first insulating layer 22 may be a passivation film. The first insulating layer 22 may be formed only of a material other than a resin ($SiO_2$ or SiN, for example), or may include a resin layer. An opening which exposes a part (center, for example) of the pad 14 is formed in the first insulating layer 22. Specifically, the first insulating layer 22 is formed to avoid at least the center of the pad 14. The first insulating layer 22 may be placed on the end portions of the pad 14.

The second insulating layer 24 is formed on the first insulating layer 22. The second insulating layer 24 may be formed of a resin such as a polyimide resin, silicone-modified polyimide resin, epoxy resin, silicone-modified epoxy resin, benzocyclobutene (BCB), or polybenzoxazole (PBO). The second insulating layer 24 may be formed only of a material other than a resin ($SiO_2$ or SiN, for example). The second insulating layer 24 may have elastic deformation properties (or a stress relaxation function). The second insulating layer 24 may be formed in a region of a part of the first insulating layer 22. The second insulating layer 24 may be formed at a position close to one of end portions of the semiconductor substrate 10 (semiconductor chip or a region of a semiconductor wafer which becomes one semiconductor chip), for example. At least a part (only a part, for example) of the second insulating layer 24 may be formed in a region which overlaps the integrated circuit 12. The second insulating layer 24 may have an inclined side surface.

The insulating layer 20 has first and second surfaces 26 and 28. The second surface 28 is formed to be higher than the first surface 26 with respect to the semiconductor substrate 10. The first surface 26 may be the surface (upper surface) of the first insulating layer 22. The second surface 28 may be the surface (upper surface) of the second insulating layer 24.

The semiconductor device includes first and second electrodes 32 and 34. The first and second electrodes 32 and 34 may not be electrically connected outside the semiconductor substrate 10. The first electrode 32 is formed to avoid the second surface 28. The first electrode 32 shown in FIG. 1 is the pad 14. The first electrode 32 is electrically connected with the inside of the semiconductor substrate 10 (integrated circuit 12, for example). A bump 36 may be formed on the first electrode 32. The first electrodes 32 may be rearranged (pitch-converted) on the first insulating layer 22. The first electrodes 32 may be arranged in a plurality of columns. In the case where the first electrodes 32 are arranged in a plurality of columns, the first electrodes 32 may be disposed in a staggered arrangement.

The second electrode 34 is formed on the second surface 28. Therefore, the second electrode 34 is formed at a position higher than the first electrode 32. In the example shown in FIG. 2, since the second electrodes 34 are disposed in a staggered arrangement, the pitch can be increased. The second electrodes 34 may be disposed in a single column. A bump 38 may be formed on the second electrode 34. The bumps 36 and 38 may be formed of the same material. The bumps 36 and 38 may be formed of solder, Ni, Au, Cr, Al, or the like. The bumps 36 and 38 may be formed by a plurality of layers.

The second electrode 34 is electrically connected with the inside of the semiconductor substrate 10 (integrated circuit 12, for example). The pad 14 may be electrically connected with the second electrode 34 through an interconnecting line 40. The interconnecting line 40 is formed from the pad 14 so as to extend to the second surface 28. The interconnecting line 40 may pass over the first surface 26.

Figure 3A:
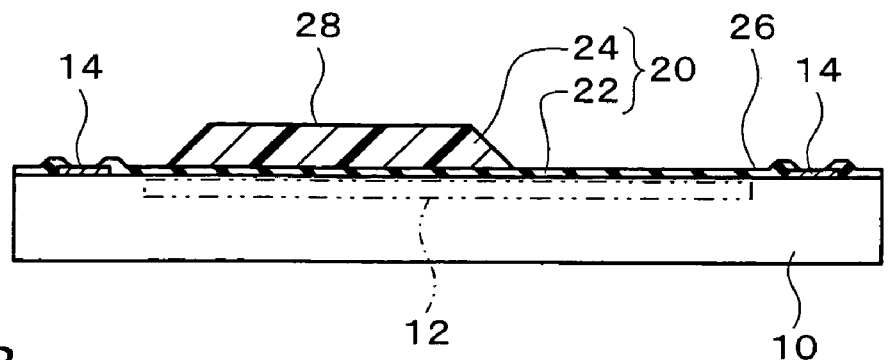
FIGS. 3A to 3D are illustrative of a method of manufacturing a semiconductor device according to one embodiment of the present invention.

FIGS. 3A to 4C are illustrative of a method of manufacturing the semiconductor device according to one embodiment of the present invention. As shown in FIG. 3A, the insulating layer 20 (first and second insulating layers 22 and 24, for example) having the first surface 26 and the second surface 28 higher than the first surface 26 is formed on the semiconductor substrate 10. In the case where the semiconductor substrate 10 is a semiconductor wafer, the second insulating layer 24 is formed in the region which becomes the semiconductor chip. The second insulating layer 24 is formed in the region which overlaps the integrated circuit 12. The second insulating layer 24 may be formed by patterning (etching, for example) an insulating layer (resin layer, for example) formed on the semiconductor substrate 10 (entire surface of the semiconductor substrate, for example).

Figure 3B:
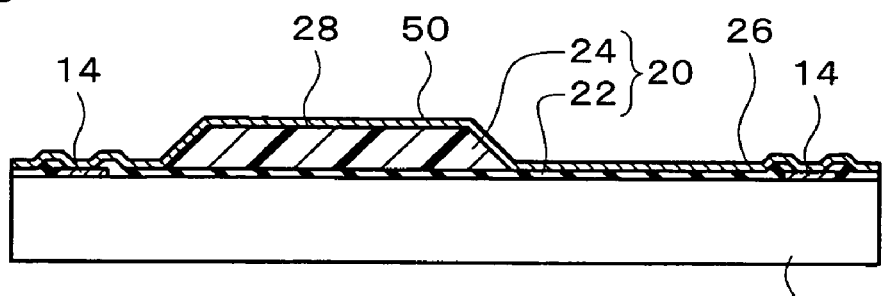

As shown in FIG. 3B, a single-layer or multilayer conductive film 50 is formed. The conductive film 50 may be formed by using a TiW film and a Cu film formed on the TiW film, for example. The conductive film 50 may be formed by sputtering. The conductive film 50 may be formed over the entire first and second surfaces 26 and 28.

Figure 3C:
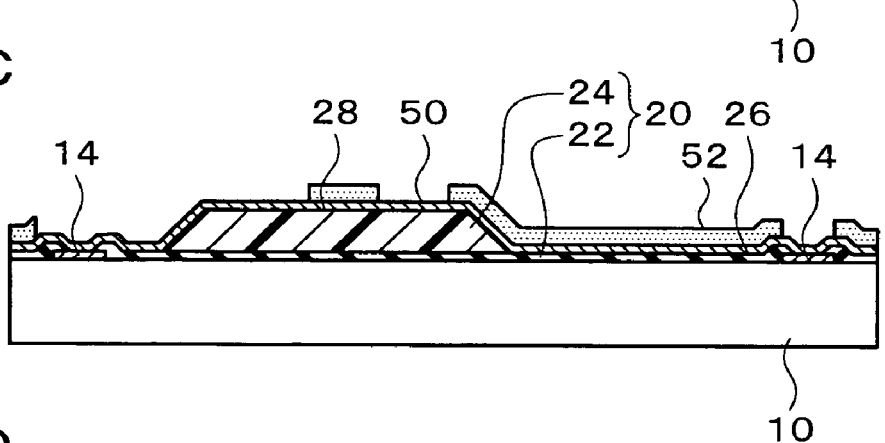

As shown in FIG. 3C, a first resist layer 52 (resin layer, for example) is formed on the conductive film 50 so as to exclude the regions of the first and second electrodes 32 and 34. In the case of forming the interconnecting line 40 (see FIG. 2), the first resist layer 52 is formed to exclude the region of the interconnecting line 40. A resist layer formed on the conductive film 50 (entire surface of the conductive film 50, for example) may be patterned by using a photolithographic step and the like.

Figure 3D:
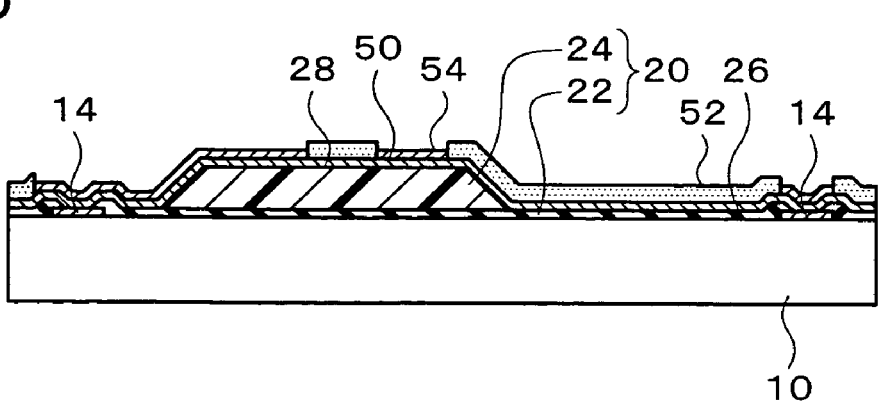

As shown in FIG. 3D, a first metal layer 54 (Cu layer, for example) is formed on the surface of the conductive film 50 exposed from the first resist layer 52 by electroplating using the conductive film 50 as an electrode. The first metal layer 54 may be formed by electroless plating. The first resist layer 52 is then removed.

Figure 4A:
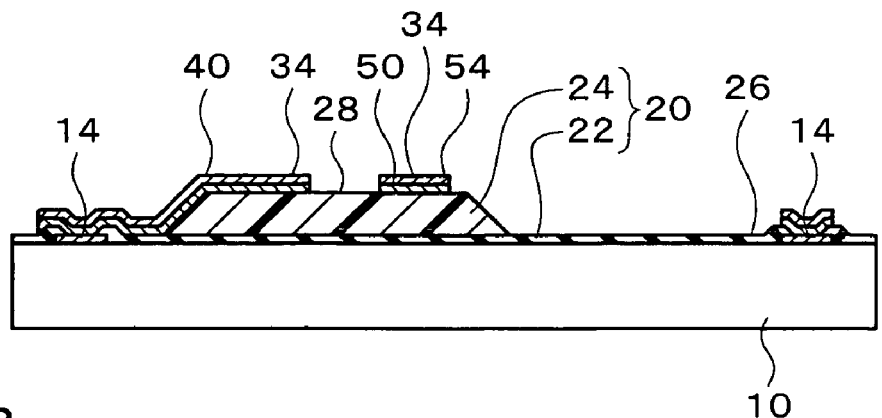
FIGS. 4A to 4C are illustrative of a method of manufacturing a semiconductor device according to one embodiment of the present invention.

As shown in FIG. 4A, the conductive film 50 is etched by using the first metal layer 54 as a mask. The second electrode 34 and the interconnecting line 40 can be formed by this step. The second electrode 34 is formed on the second surface 28. Note that the pad 14 is the first electrode 32 in this embodiment.

Figure 4B:
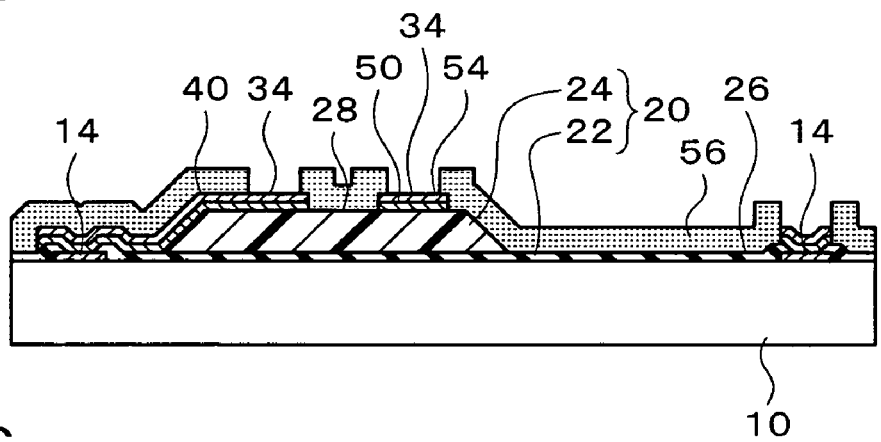

As shown in FIG. 4B, a second resist layer 56 (resin layer, for example) is formed so as to exclude the formation regions of the bumps 36 and 38 (at least the center of the first and second electrodes 32 and 34).

Figure 4C:
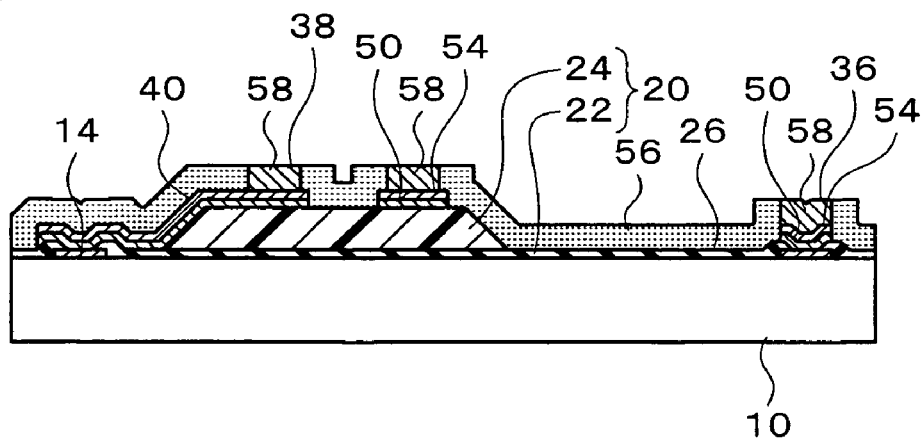

As shown in FIG. 4C, a single-layer or multilayer second metal layer 58 (solder, Ni, Au, Cr, or Al, for example) is formed on the surface of the first metal layer 54 exposed from the second resist layer 56 (formation regions of the bumps 36 and 38). The bumps 36 and 38 are formed by this step.

In the case where the semiconductor substrate 10 is a semiconductor wafer, the method of manufacturing the semiconductor device may include a step of cutting (dicing) the semiconductor substrate 10. The rest of the details of the manufacturing method is derived from the configuration of the above-described semiconductor device. According to this embodiment, since the first and second electrodes 32 and 34 are formed on the surfaces at different heights, the semiconductor device can be mounted in a region with a level difference.

Figure 5:
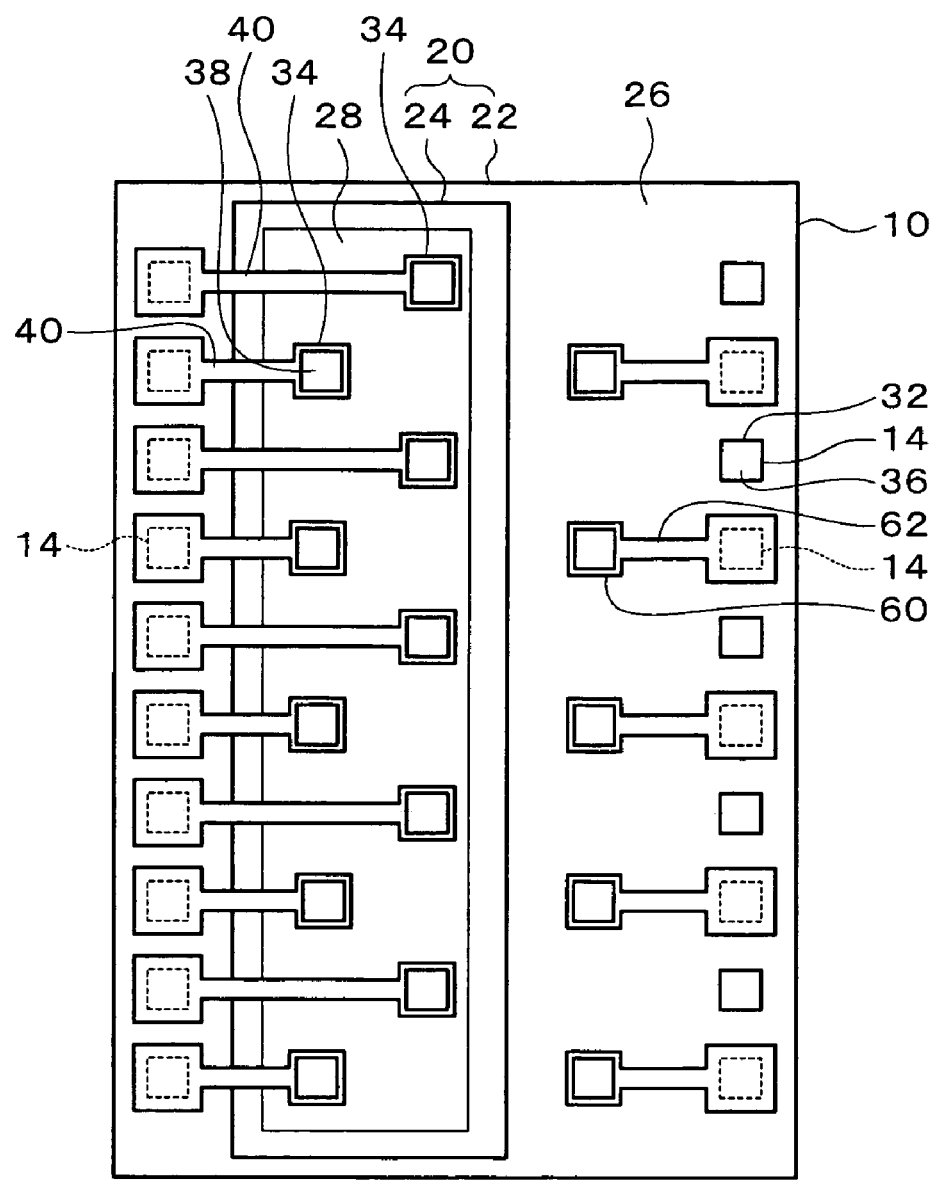
FIG. 5 is illustrative of a modification of a semiconductor device according to one embodiment of the present invention.

FIG. 5 is illustrative of a modification of the semiconductor device according to one embodiment of the present invention. The semiconductor device shown in FIG. 5 includes a first electrode 60 formed on the first surface 26. The rest of the configuration is the same as the configuration of the above-described semiconductor device. The first electrode 60 is electrically connected with one of the pads 14 through an interconnecting line 62. Since the first electrodes 32 and the first electrodes 60 are disposed in a staggered arrangement, the pitch can be increased. The present invention also includes this embodiment.

Figure 6:
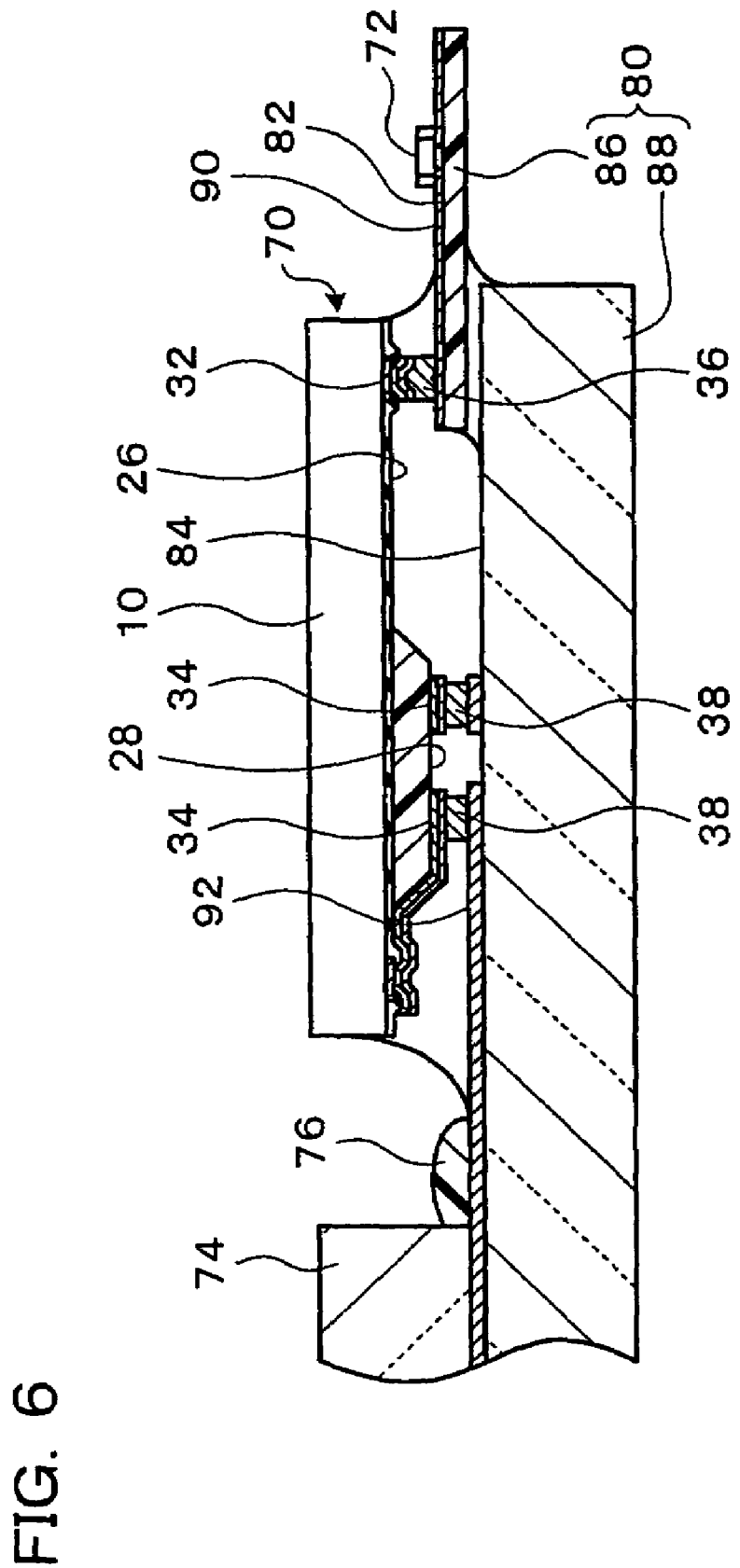
FIG. 6 is illustrative of an electronic device according to one embodiment of the present invention.

FIG. 6 is illustrative of an electronic device according to one embodiment of the present invention. The electronic device includes the above-described semiconductor device 70. The electronic device includes a support member 80. The support member 80 includes a first support surface 82 and a second support surface 84 lower than the first support surface 82. The support member 80 may include first and second substrates 86 and 88. The first and second substrates 86 and 88 are attached so as to have an overlapping region. The first and second substrates 86 and 88 may be attached by using an adhesive or the like. The first substrate 86 is a flexible substrate, for example. An electronic part 72 may be mounted on the first substrate 86. The second substrate 88 is at least a part of an electronic panel (liquid crystal panel, electroluminescent panel, or the like). In a liquid crystal panel, another substrate 74 is provided so as to face the second substrate 88. The second substrate 88 is disposed to project from the substrate 74. A resin 76 may be provided on the second support surface 84 of the second substrate 88 in the peripheral section of the substrate 74.

The surface of the first substrate 86 opposite to the second substrate 88 in the overlapping region with the second substrate 88 is the first support surface 82. The surface of the second substrate 88 on the side of the first substrate 86 outside the overlapping region with the first substrate 86 is the second support surface 84.

A first interconnecting pattern 90 is formed on the first support surface 82, and a second interconnecting pattern 92 is formed on the second support surface 84. The first electrode 32 of the semiconductor device 70 is electrically connected face-to-face with the first interconnecting pattern 90. The second electrode 34 of the semiconductor device 70 is electrically connected face-to-face with the second interconnecting pattern 92.

According to this embodiment, the semiconductor device 70 includes the first and second electrodes 32 and 34 formed on the surfaces at different heights, and is mounted in the region with a level difference (first and second support surfaces 82 and 84). Since only a part of the semiconductor device 70 overlaps the first substrate 86, the size of the first substrate 86 can be reduced.

Figure 7:
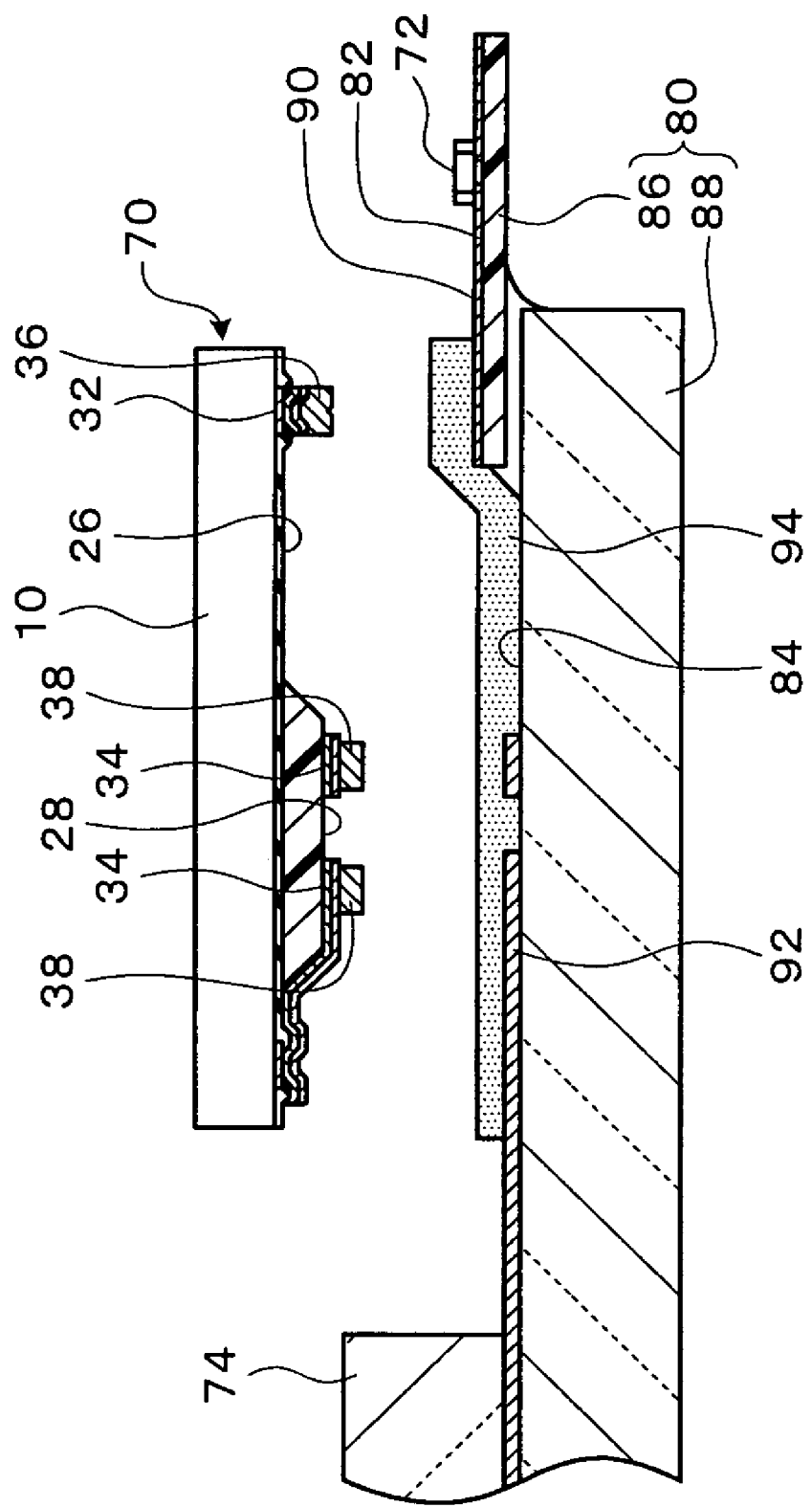
FIG. 7 is illustrative of a method of manufacturing an electronic device according to one embodiment of the present invention.

FIG. 7 is illustrative of a method of manufacturing the electronic device according to one embodiment of the present invention. This manufacturing method includes a step of mounting the semiconductor device 70 on the support member 80 having the first support surface 82 and the second support surface 84 lower than the first support surface 82. Specifically, the first and second substrates 86 and 88 are attached before mounting the semiconductor device 70. The first electrode 32 of the semiconductor device 70 is electrically connected face-to-face with the first interconnecting pattern 90. The second electrode 34 of the semiconductor device 70 is electrically connected face-to-face with the second interconnecting pattern 92. An anisotropic conductive material 94 (anisotropic conductive film or anisotropic conductive paste) may be used to electrically connect the electrode with the interconnecting pattern.

According to this embodiment, since the first and second electrodes 32 and 34 of the semiconductor device 70 are formed on the surfaces at different heights, the semiconductor device 70 can be mounted in a region with a level difference (first and second support surfaces 82 and 84).

Figure 8:
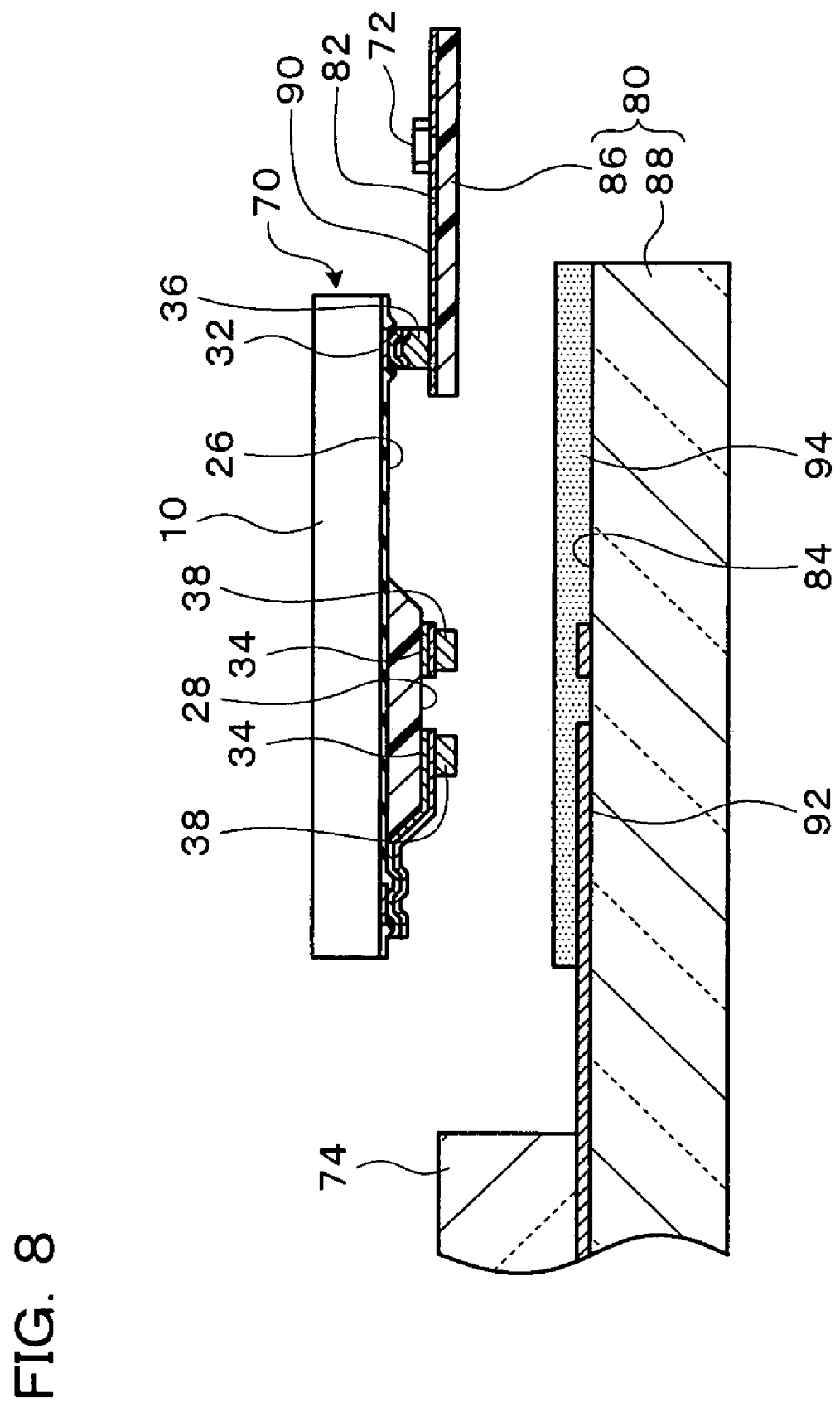
FIG. 8 is illustrative of a method of manufacturing an electronic device according to another embodiment of the present invention.

FIG. 8 is illustrative of a method of manufacturing an electronic device according to another embodiment of the present invention. In this manufacturing method, the first electrode 32 of the semiconductor device 70 is electrically connected face-to-face with the first interconnecting pattern 90 formed on the first substrate 86. Specifically, the semiconductor device 70 is mounted on the first substrate 86 before being mounted on the second substrate 88. The semiconductor device 70 and the first substrate 86 are then attached to the second substrate 88. In more detail, the second electrode 34 of the semiconductor device 70 is electrically connected face-to-face with the second interconnecting pattern 92 formed on the second substrate 88. The anisotropic conductive material 94 (anisotropic conductive film or anisotropic conductive paste) may be used to electrically connect the electrode with the interconnecting pattern. The first substrate 86 is attached to the second substrate 88 so that the electrical connection section of the first interconnecting pattern 90 with the first electrode 34 overlaps the second substrate 88. The anisotropic conductive material 94 may be used for attachment.

According to this embodiment, a level difference is formed by allowing the first and second substrates 86 and 88 to overlap. However, since the first and second electrodes 32 and 34 of the semiconductor device 70 are formed on the surfaces at different heights, it is possible to deal with the level difference.

Figure 9:
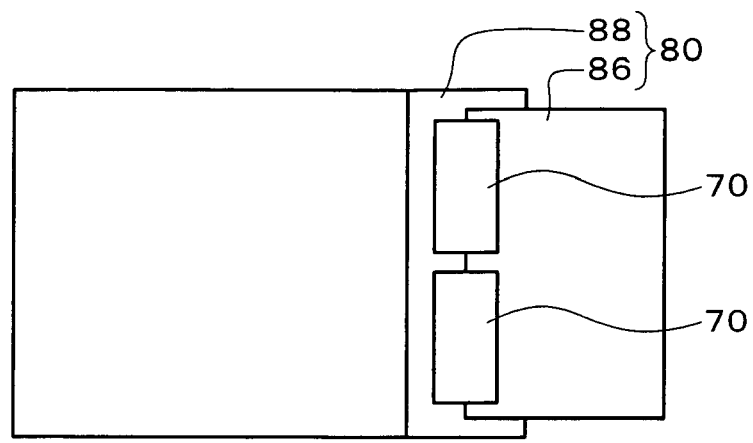
FIG. 9 is illustrative of a modification of an electronic device according to one embodiment of the present invention.

FIG. 9 is illustrative of a modification of an electronic device according to one embodiment of the present invention. In the electronic device shown in FIG. 9, a plurality of the semiconductor devices 70 are mounted on the support member 80. The above description applies to the details of the structure and the mounting form of the semiconductor device 70. The present invention also includes this embodiment.

Figure 10:
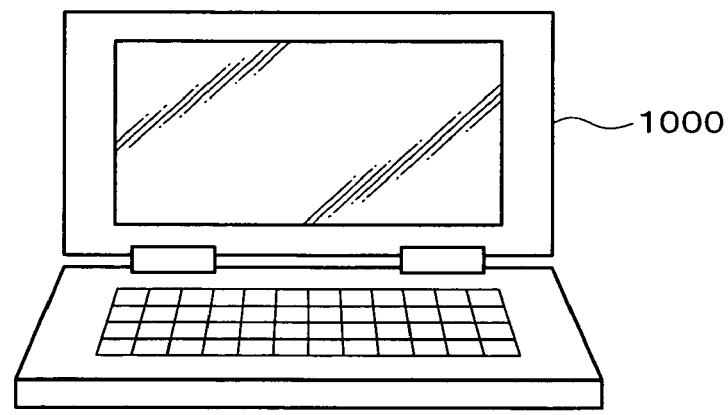
FIG. 10 shows an electronic instrument including a semiconductor device according to one embodiment of the present invention.
Figure 11:
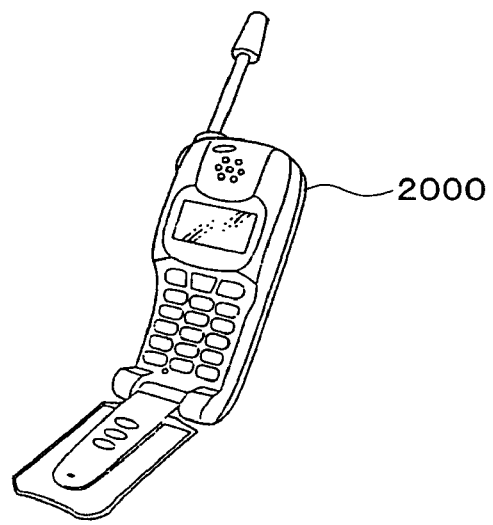
FIG. 11 shows an electronic instrument including a semiconductor device according to one embodiment of the present invention.

FIGS. 10 and 11 respectively show a notebook-type personal computer 1000 and a portable telephone 2000 as examples of electronic instruments including the semiconductor device or the electronic device according to the embodiments of the present invention.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. An electronic device comprising:
    a semiconductor substrate in which an integrated circuit is formed;
    a first insulating layer formed on the semiconductor substrate and having a first surface;
    a second insulating layer formed on the first insulating layer and having a second surface which is higher than the first surface, the second insulating layer formed at a position closer to one end portion of the semiconductor substrate than all the other end portions of the semiconductor substrate;
    a first electrode formed on the first surface without electrical connection with any conductor on the second surface and electrically connected to the inside of the semiconductor substrate;
    a second electrode formed on the second surface and electrically connected to the inside of the semiconductor substrate;
    a support member which includes a first support surface and a second support surface lower than the first support surface;
    a first interconnecting pattern formed on the first support surface; and
    a second interconnecting pattern formed on the second support surface, wherein:
    the first electrode of the semiconductor device faces and is electrically connected to the first interconnecting pattern; and
    the second electrode of the semiconductor device faces and is electrically connected to the second interconnecting pattern, wherein:
    the support member includes first and second substrates which overlap each other to provide an overlapping region;
    the first support surface includes a surface of the first substrate opposite to the second substrate and within the overlapping region; and
    the second support surface includes a surface of the second substrate on the side of the first substrate and outside the overlapping region; and
    the first interconnection pattern and the first substrate stick out from a side of the second substrate.

2. An electronic instrument comprising the electronic device as defined in claim 1.

* * * * *